United States Patent [19]

Lee

[11] Patent Number: 5,665,657

[45] Date of Patent: Sep. 9, 1997

[54] SPIN-ON-GLASS PARTIAL ETCHBACK PLANARIZATION PROCESS

[75] Inventor: Jin-Yuan Lee, Hsin-Chu, Taiwan

[73] Assignee: Taiwan Semiconductor Manufacturing Company, Ltd., Hsin-Chu, Taiwan

[21] Appl. No.: 529,636

[22] Filed: Sep. 18, 1995

[51] Int. Cl.⁶ ............................................. H01L 21/465
[52] U.S. Cl. .......................... 438/624; 438/631; 438/699
[58] Field of Search ....................... 156/657.1, 643.1; 437/228, 231, 235, 238, 978; 216/38, 72

[56] References Cited

U.S. PATENT DOCUMENTS

| | | | |
|---|---|---|---|
| 4,775,550 | 10/1988 | Chu et al. | 437/228 |
| 4,826,786 | 5/1989 | Merenda et al. | 437/231 |
| 4,894,351 | 1/1990 | Batty | 437/228 |
| 5,204,288 | 4/1993 | Marks et al. | 437/235 |
| 5,212,114 | 5/1993 | Grewal et al. | 437/192 |
| 5,250,472 | 10/1993 | Chen et al. | 437/235 |
| 5,296,092 | 3/1994 | Kim | 156/643.1 |
| 5,308,795 | 5/1994 | Hawley et al. | 437/195 |
| 5,331,117 | 7/1994 | Bryant et al. | 174/250 |
| 5,371,046 | 12/1994 | Liaw et al. | 437/195 |
| 5,382,547 | 1/1995 | Sultan et al. | 437/231 |
| 5,393,708 | 2/1995 | Hsia et al. | 437/238 |
| 5,472,825 | 12/1995 | Sayka | 430/311 |
| 5,514,624 | 5/1996 | Morozumi | 437/231 |

FOREIGN PATENT DOCUMENTS 2-84724A  3/1990  Japan ................... 437/238

*Primary Examiner*—R. Bruce Breneman
*Assistant Examiner*—Anita Alanko
*Attorney, Agent, or Firm*—George O. Saile; William J. Stoffel

[57] ABSTRACT

A method for forming a planarization SOG layer which eliminates voids in SOG layers in-between closely spaced conductive lines is provided. A first dielectric layer is formed over the spaced conductive lines thus forming voids or closed cavities in the first dielectric layer between the lines. The first dielectric layer is covered with a first spin-on-glass layer. The first spin-on-glass layer is anisotropically etched to a depth which exposes the voids and forms open hollows. Subsequently, a second spin-on-glass layer is formed over the remaining first spin-on-glass layer whereby the voids or open hollows are filled with the second spin-on-glass layer. The second spin-on-glass layer is etched to expose the first dielectric layer in the via hole areas. Subsequently, a second dielectric layer is deposited over the first and second spin-on-glass layers to complete the planarization. This process fills voids formed in the first dielectric layer and forms a smoother top surface. The process forms via holes that do not adjoin the SOG layers, thereby reducing the poison via problem.

24 Claims, 2 Drawing Sheets

SPIN-ON-GLASS PARTIAL ETCHBACK PLANARIZATION PROCESS

BACKGROUND OF INVENTION

1) Field of the Invention

The present invention relates to a method for manufacturing a semiconductor device, and more particularly to a method for planarizing an insulating interlayer to be used in conjunction with other multilevel interconnect technology.

2) Description of the Prior Art

To manufacture an integrated circuit, it is necessary to form many active devices on a single substrate. Initially, each of the devices must be isolated from the others, but recently it has become necessary to electrically interconnect specific devices during the fabrication step to obtain the desired functionality of the circuit. Both MOS and bipolar devices have multilevel interconnect structures to accommodate the numerous interconnections of the devices.

As the number of layers in an interconnect structure increase, the topography of the top layer coated on the semiconductor wafer becomes more rugged. For example, in manufacturing a semiconductor wafer having two or more metal layers formed thereon, a first insulating interlayer is coated on the wafer on which a plurality of oxide layers, polycrystalline silicon conductive layers and a first metal wiring layer, have been previously formed, followed by forming vias for interposing a second metal layer. The surface of the first insulating layer is uneven because the underlying structure which the first insulating layer has was formed upon is uneven. When a second metal layer is directly formed over such a first insulating interlayer, the metal lines of the second layer may short to each other due to poor photo resolution on the uneven surface and because metal stringers of the second metal layer remain in the gaps of two metal lines of the first metal layer. This failure lowers the yield of the semiconductor device. Therefore, planarization of the insulating interlayer is required for multilevel metal interconnections, before forming a via or coating a second metal layer.

One of the simplest methods available for planarizing the semiconductor wafer having steps formed thereon is to deposit a chemical vapor deposition (CVD) glass layer which is significantly thicker than the step height it must cover. However, this is unrealistic because increasing the thickness of the insulating layer also increases the via depth between a first metal wiring layer and a second metal layer. Furthermore, as the first metal wiring layers become more closely packed, voids will form in the insulating layer if conventional CVD-SiO2 processes are used.

One conventional planarization method is to form an insulating layer includes using a resist layer coated on an insulating interlayer as a sacrificial layer. The process comprises coating a resist layer and etching back the insulating interlayer by using the resist layer as a sacrificial layer to adjust the thickness of the insulating interlayer.

In the next step, the sacrificial resist layer is first rapidly etched back by dry etching until the topmost regions of the insulating interlayer are just barely exposed. The etch chemistry is then modified so that the sacrificial layer material and the insulating interlayer material are etched at approximately the same rate. Etching continues under these conditions until all of the sacrificial resist layer has been etched away. By this etch-back procedure, the surface of the insulating interlayer is highly planarized since the profile of the sacrificial layer is thus transferred to the insulating interlayer. In some cases, the thickness of the insulating interlayer over underlying metal layers may be thinner than desired after the etch-back step is completed. In other cases, etch-back is allowed to proceed until the first metal wiring layers are exposed for improving the degree of planarization. In such a case, an additional CVD insulating layer is generally deposited in order to establish the minimum adequate thickness of the insulating interlayer.

As the integration density of semiconductor/devices increases, the spaces between the metal layers become narrower. Therefore, various problems such as the formation of voids in the insulating interlayer occur, so its planarization becomes difficult to improve. To improve the degree of planarization of the insulating layer formed over such closely spaced metal layers, a method of repeating the etch-back step two times has been typically carried out. However, the conventional two step etch back process does not adequately solve the problem of void formation in the first dielectric layer.

Another dielectric planarization scheme involves spin-on-glass (SOG) dielectric material. Spin-on-glass is a smoothing dielectric applied by spin coating that fills the spaces in the smaller geometries. When thin layers of SOG in the range of 1000 Å and thicker are used a chemical vapor deposition (CVD) dielectric is needed to form the isolation between the SOG layer and the underlying metal layers.

As a result of several problems, such as adhesion loss and degradation of film stability, a sandwich scheme with a layer of SOG encapsulated between two layers of CVD dielectric is effective in obtaining planarization without the problems exhibited by a single layer of CVD and a single layer of SOG. The bottom dielectric layer serves as an adhesion and hillock suppresser layer and should prevent the SOG from coming in contact with the metal. SOG is the middle layer and serves primarily as the planarization layer. Finally a top CVD dielectric serves as an isolation layer.

This three level sandwich structure has several drawbacks. First, voids in the first dielectric layer are still formed between closely spaced metal lines. Particularly, when the spacing between the metal lines is less than twice the first dielectric layer thickness. These voids in the first dielectric layer are covered over by the middle SOG layer and the second dielectric layer.

Second, via poisoning occurs in the vias where the SOG layer touches the metal contacts. Where the spin-on-glass layer contacts the metal contacts in via holes, moisture from the spin-on-glass layer attacks the metal contact causing electrical failures.

Several patents have attempted to improve the SOG sandwich structure process by using a double SOG layer etch back process. This process begins by forming a first dielectric layer and a first SOG layer. Then the first SOG layer can be etched back. After this, a second SOG layer and a second dielectric layer is formed over the first SOG layer.

The following patents teach some variations on this process: KIM, U.S. Pat. No. 5,296,092 (uses 3 dielectric layers and 2 SOG layers), Hawley et al. U.S. Pat No. 5,308,795 (Uses the metal layer as an etch back stop), Grewal et. al., U.S. Pat. No. 5,212,114 and Chen et al. U.S. Pat. No. 5,250,472 (etches back a first SOG layer but does not etch back the second SOG layer). However, these process do not adequately solve the above problems of the voids, via poisoning and adequate planarization.

It is desirable to develop a planarization process which provides void-free planarization layers between conductive lines, provides improved planarity and reduces poison via problems

SUMMARY OF THE INVENTION

It is an object of the present invention to provide a method of forming an inter-metal dielectric layer the provides void-free planarization layers between conductive lines.

It is another object of the present invention to provide a method of forming an inter-metal dielectric layer the provides void-free planarization layers, improves planarization (i.e., a smoother top surface), and reduces the poison via problem.

According to the present invention, a method for the planarizing of a semiconductor substrate is provided which comprises the following steps. A semiconductor substrate is provided having spaced conductive lines which present a non-planar top surface. Next a first dielectric layer is formed over the non-planar top surface whereby potential voids can be formed between the spaced conductive lines.

The first dielectric layer is then covered with a first spin-on-glass layer. The first spin-on-glass layer is anisotropically etched to a depth which exposes the potential voids and to a depth which does not expose the spaced conductive lines. Subsequently, a second spin-on-glass layer is formed over the remaining first spin-on-glass layer whereby the potential voids are filled with the second spin-on-glass layer. Both the first and second spin-on-glass layers are now cured.

At least the second spin-on-glass layer is etched to expose at least portions of the first dielectric layer over the spaced conductive lines. The second SOG layer is completely etched away over via hole areas over the conductive lines. Because the SOG layer is not present in the via hole, the via poison problem is reduced. Also the second SOG layer remains filling the voids thus presenting a more planar top surface.

Subsequently, a second dielectric layer is deposited over the first and second spin-on-glass layers to complete the planarization. Thus the invention provides improved planarization, void-free dielectric layers and reduces poison via problems.

DETAILED DESCRIPTION OF THE PREFERRED EMBODIMENTS

The present invention will be described in detail with reference to the accompanying drawings. It should be noted that the drawings are in greatly simplified form. In practice the semiconductor device structure will be one of many supported on a common substrate connected with suitable metallurgy in various electronic electric circuit configurations. The substrate 10 shall be a monocrystalline silicon semiconductor body with many devices fabricated therein, as is well known in the art. The substrate can have active and passive devices formed therein and thereon. The substrate can include one or more layers of patterned metallurgy and insulating layers (not shown).

Figure 1:
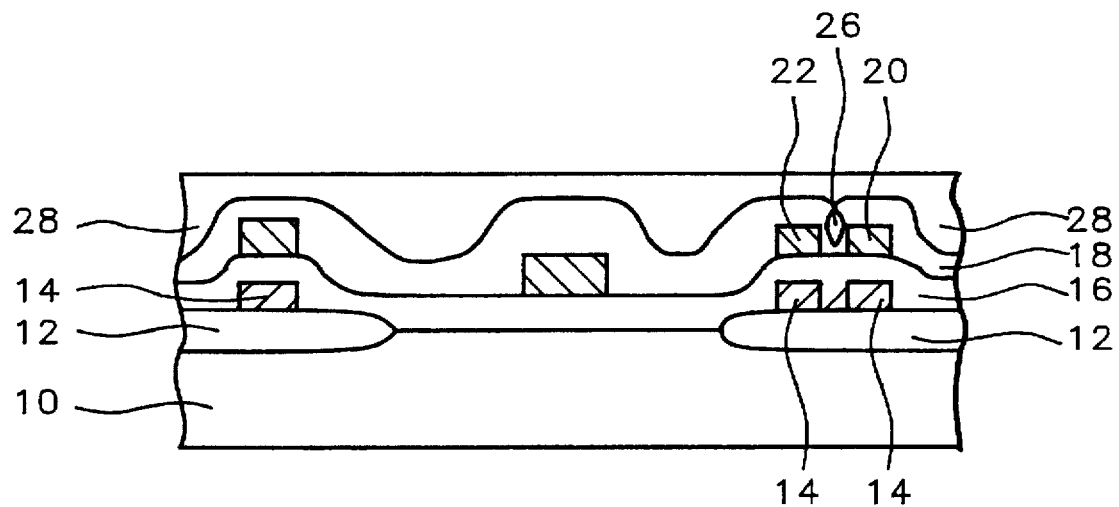
FIGS. 1 through 3 are cross sectional views for explaining the process of the present invention for forming and planarizing an dielectric layer over conductive lines which provide a void free planarization layer.

FIG. 1 shows a planarized multi-layer metallization structure with closely spaced conductive lines 14, 20, 22. Field oxide regions 12 are formed on the substrate 10 using a conventional process, such as a thermal oxidation process. Polysilicon gate structures 14 are formed on field oxide regions 12. A first insulating layer 16 layer is formed thereover by conventional means. A conductor layer has been deposited and patterned by lithography and etching to form spaced conductive lines 20, 22. The spaced conductive lines 20, 22 and the surface of the substrate present a non-planar top surface having valleys between the spaced conductive lines 20, 22. It is within these valleys that voids in SOG layers can form. The distance between the spaced conductive lines can be in the range of about 0.3 to 1.0 μm.

Next a four level sandwich structure 18, 28, 30, 32 is formed over the conductive lines 20 22. See FIGS. 1, 2, 3. The four level sandwich layer is composed of: (1) a first dielectric layer 18, (2) first spin-on-glass (SOG) layer 28, (3) second SOG layer 30; and (4) a second dielectric layer 32.

The first dielectric layer 18 is formed over the non-planar top surface whereby potential voids 26 can be formed between the spaced conductive lines as shown in FIG. 1. The first dielectric layer 18 can be formed of plasma enhanced chemical vapor deposition (PECVD) oxide, plasma enhanced TEOS oxide and is preferably composed of silicon oxide formed by a plasma enhanced chemical vapor deposition process (PECVD). The first dielectric layer has a thickness in the range of about 3000 to 10,000 Å and more preferably between about 5000 and 10,000 Å. The first dielectric layer can have a thickness greater than one half of the distance between the spaced conductive lines. When the first dielectric layer thickness is greater than one half the spacing between the conductive lines, the first dielectric layer can then form voids or closed cavities 26 in the valley between the conductive lines 20 where the upper portions of the layer meet. See FIG. 1. These voids are exemplary of the voids formed by of the prior art process.

Next, the first dielectric layer 18 is covered with a first spin-on-glass (SOG) layer 28. The first SOG layer can be formed of polyimide and siloxane materials. A conventional SOG material can be used, such as Allied Signal's X11, X14 SOG or TOK's Type 7 SOG.

The first SOG layer can have a thickness in the range of about 1000 to 7000 and more preferably a thickness of about 4000 Å. The first spin-on-glass layer can optionally be cured prior to the anisotropic etch. The curing can be carried out under the following conditions: a temperature between about 400° to 500 ° C., a pressure between about 30 to 60 mm of vacuum or in an inert gas ambient. The curing step has the advantage of stabilizing the SOG layer and also making the etch rate more uniform.

Figure 2:
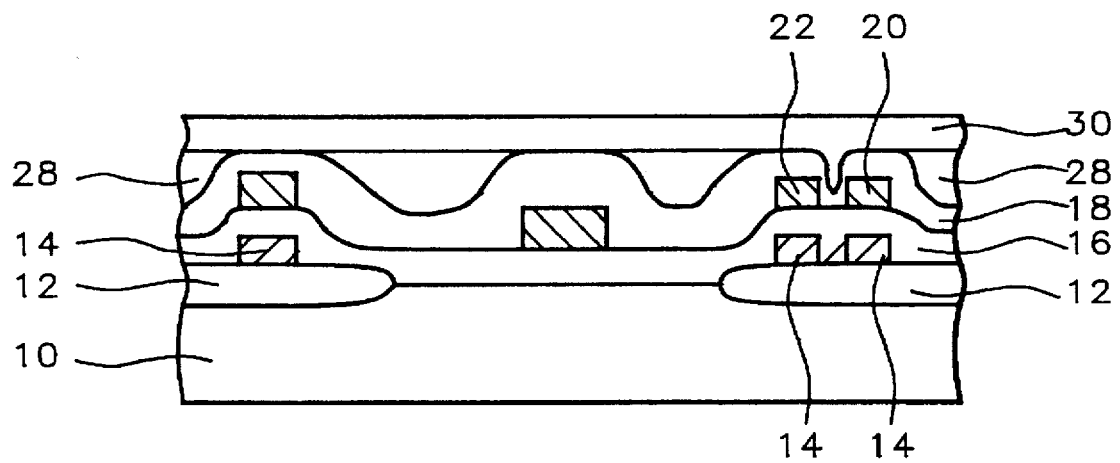

The first spin-on-glass layer 28 and the first dielectric layer 18 are then anisotropically etched to a depth which exposes the potential voids and forms open hollows. The anisotropic etching continues to a depth which does not expose the spaced conductive lines as shown in FIG. 1. It is critical that the first SOG and first dielectric layer 18 are etched to open up the voids 26 so that the subsequent second SOG layer 30 can fill the voids or open hollows as shown in FIG. 2. Also, it is preferred not to etch to expose the conductive lines because etching can degrade the conductive lines. Also, etching down past the conducive lines makes the surface uneven (non-planar). The first spin-on-glass layer 28 also can be formed by applying more than one spin-on-glass layer to thereby form the correct SOG thickness.

The etch process should be controlled so that the etch selectivity of SOG with respect to the first dielectric layer (preferably PECVD oxide) is approximately 1:1. The selectivity can be controlled by changing gas flow ratio of $CHF_3/CH_4$. The higher the $CHF_3/CH_4$ ratio, the high the selectivity of SOG to PE-Oxide.

When the first spin-on-glass layer is formed of a siloxane material, the anisotropic etch back of the first spin-on-glass layer has the conditions of about: a $CHF_3$ flow of between 27 and 33 sccms and more preferably about 30 sccm, a $CF_4$ flow between about 45 to 55 sccm and more preferably about 50 sccm, a Pressure between about 270 to 330 mtorr and more preferably about 300 mTorr, and a Power between about 450 to 550 watts and more preferably about 500 Watt. The etch can be performed in LAM 4520 etcher.

The remaining first spin-on-glass layer is covered with a second spin-on-glass layer 30 whereby the potential voids are filled with the second spin-on-glass layer. The second spin-on-glass layer can be composed silicate or siloxane material.

The second spin-on-glass layer 30 has a thickness of between about 1000 and 6000 Å and more preferably has a thickness of about 3000 Å.

Both the first and second spin-on-glass layers can be then cured. The curing of the first and second spin-on-glass has the conditions: a nitrogen atmosphere, boat in and stabilize the temperature between about 370° and 380° C., then ramp up to between about 420° to 430° C. in a time between about 25 to 35 minutes and curing at a temperature between about 420° to 430° C. for about 30 to 90 minutes, and ramp down to about 370° to 380° C. in a time between about 25 to 35 minutes.

Figure 3:
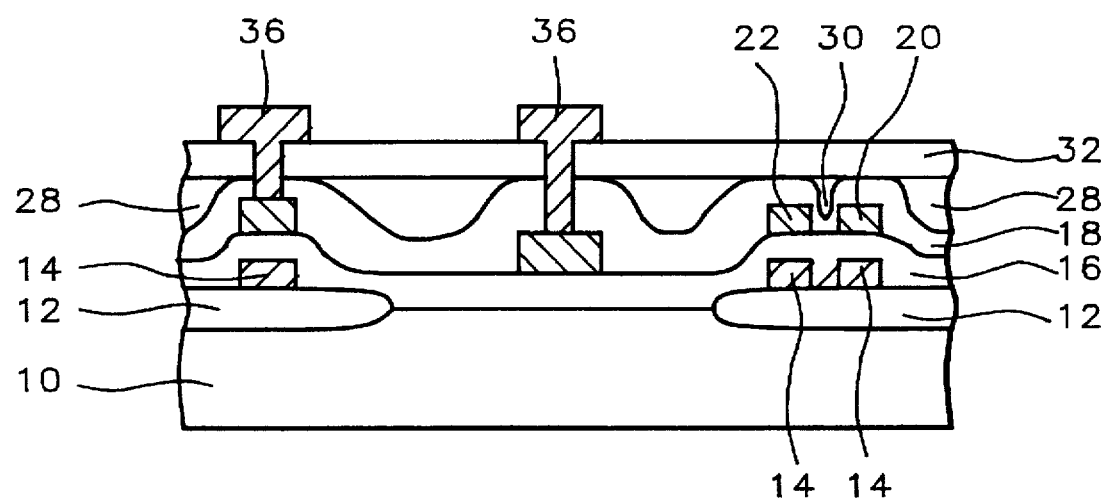

Then, at least the second spin-on-glass layer 30 is etched to expose at least portions of the first dielectric layer over the spaced conductive lines as shown in FIG. 3. The second SOG layer 30 is completely etched away over via hole areas over the conductive lines. Because the SOG layer is not present in the via hole, the via poison problem is reduced. Also the second SOG layer remains filling the voids thus presenting a more planar top surface. The second spin-on-glass layer 30 also can be formed by applying more than one spin-on-glass layer to form the correct SOG thickness. The second spin-on-glass layer can be formed of siloxane or silicate material and is preferably formed of siloxane.

The second SOG layer 30 is preferably etched by a anisotropic process because of the anisotropic process's superior selectivity and control. The anisotropic etch process can be performed in RIE oxide etcher. The selectivity can be adjusted by changing gas flow ratios of $CHF_3/CH_4$ the selectivity should be controlled in the range of about 0.9 to 1.1 so that the planarization can be maintained.

As shown in FIG. 3, a second dielectric layer 32 is deposited over the first and second spin-on-glass layers 28, 30 to complete the planarization. The second dielectric layer 32 has a thickness of between about 2000 to 6000 Å. The second dielectric layer 32 can be formed of a plasma enhanced silicon oxide or a plasma enhanced nitride and is preferably formed of a silicon oxide formed by a plasma enhanced chemical vapor deposition process.

Via holes are then etched in selected locations through the first and second dielectric layers 18 32 to expose the spaced conductive lines 22 24. Finally, metal contacts 36 are formed through the via holes to contact the conductive lines 22 24 as shown in FIG. 3.

Thus the invention provides improved planarization, void-free dielectric layers and reduces poison via problems. The anisotropic etch after the first SOG layer opens the voids up. The second SOG layer then fills the voids and presents a more planar surface. Also, by etching away the first and second SOG layers in the via hole areas, the poison via problems is reduced. No SOG is in contact with the metal contacts 36, therefore the poison via problem is reduced.

While the invention has been particularly shown and described with reference to the preferred embodiments thereof, it will be understood by those skilled in the art that various changes in form and details may be made without departing from the spirit and scope of the invention. For example, while the detailed example of the integrated circuit used a MOSFET integrated circuit, it is obvious to those skilled in the are that the planarization techniques of the invention will also be applicable to bipolar, BICMOS and other types of integrated circuit devices useful in the submicron processing field. Also, the incorporation of more than one polysilicon layer 14 before the use of a first metal layer 20 is clearly useful. In this alternative, a spin-on-glass layer is useful for planarization before the metal layer 20 is formed.

What is claimed is:

1. The method of planarizing the dielectric layers between conductive layers in integrated circuits without the incorporation of voids in said dielectric layers comprising:

providing device structures in and on a semiconductor substrate;

providing at least one patterned conductive layer having spaced conductive lines for contacting of said device structures; said spaced conductive lines and the surface of said substrate present a non-planar top surface having valleys between said spaced conductive lines;

forming a first dielectric layer over said non-planar top surface whereby closed cavities are formed between said spaced conductive lines;

covering said first dielectric layer with a first spin-on-glass layer;

anisotropically etching said first spin-on-glass layer and said first dielectric layer to a depth which exposes said closed cavities and forms open hollows, wherein said etching continues to a depth which does not expose said spaced conductive lines;

covering the remaining first spin-on-glass layer with a second spin-on-glass layer whereby said open hollows are filled with said second spin-on-glass layer;

curing both said first and second spin-on-glass layers;

anisotropically etching at least said second spin-on-glass layer to expose at least portions of the first dielectric layer over said spaced conductive lines;

depositing a second dielectric layer over said first and second spin-on-glass layers to complete said planarization;

anisotropically etching via holes in selected locations through said first and second dielectric layers to expose said spaced conductive lines; and forming metal contacts through said via holes to contact said conductive lines.

2. The method of claim 1 which further includes curing said first spin-on-glass layer prior to said anisotropically etching of said first spin-on glass layer.

3. The method of claim 1 wherein said first dielectric layer has a thickness greater than one half of the distance between said spaced conductive lines.

4. The method of claim 1 wherein said first dielectric layer has a thickness between about 5000 to 10,000 Å.

5. The method of claim 1 wherein the distance between said spaced conductive lines is in the range of about 3000 to 10,000 Å and said first dielectric layer has a thickness in the range of about 3000 to 10,000 Å.

6. The method of claim 1 wherein said first dielectric layer is composed of silicon oxide formed by a plasma enhanced chemical vapor deposition process.

7. The method of claim 1 wherein said first spin-on-glass layer is formed by applying more than one spin-on-glass layers.

8. The method of claim 1 wherein said first spin-on-glass layer is composed of a material selected from the group consisting of silicate and siloxane.

9. The method of claim 1 wherein said first spin-on-glass layer is formed of a siloxane material and the anisotropic etch back of said first spin-on-glass layer has the conditions of about: a $CHF_3$ flow of between about 27 and 33 sccms, a $CF_4$ flow between about 45 to 55 sccm, a Pressure between about 270 to 330 mtorr, and a Power between about 450 to 550 watts.

10. The method of claim 1 wherein said second spin-on-glass layer is composed of a material selected from the group consisting of silicate and siloxane.

11. The method of claim 1 wherein said second spin-on-glass layer has a thickness of between about 1000 and 6000 Å.

12. The method of claim 1 wherein said second spin-on-glass layer is formed by applying more than one spin-on-glass layers.

13. The method of claim 1 wherein the curing of said first and second spin-on-glass has the conditions: a nitrogen atmosphere, stabilize the temperature between about 370° and 380° C., then ramp up to between about 420° to 430° C in a time between about 25 to 35 minutes and curing at a temperature between about 420° to 430° C. for about 30 to 90 minutes, and ramp down to about 370° to 380° C. in a time between about 25 to 35 minutes.

14. The method of claim 1 wherein said second dielectric layer has a thickness of between about 3000 to 10,000 Å and is formed by a plasma enhanced chemical vapor deposition process.

15. The method of claim 1 wherein said etching of at least said second spin-on-glass layer is performed with an anisotropic etch process.

16. The method of planarizing the dielectric layers between conductor layers in integrated circuits without the incorporation of voids in said dielectric layers comprising:

providing device structures in and on a semiconductor substrate;

providing at least one patterned conductive layer having spaced conductive lines for contacting of said device structures; said spaced conductive lines and the surface of said substrate present a non-planar top surface having valleys between said spaced conductive lines; the distance between said spaced conductive lines is in a range of about 3000 to 10,000 Å;

forming a first dielectric layer over said non-planar top surface whereby closed cavities are formed between said spaced conductive lines; said first dielectric layer has a thickness greater than one half of the distance between said spaced conductive lines; said first dielectric layer has a thickness in a range of about 3000 to 10,000 Å;

covering said first dielectric layer with a first spin-on-glass layer; said first spin-on-glass layer having a thickness in a range of between about 1000 and 7000 Å;

anisotropically etching said first spin-on-glass layer and said first insulator layer to a depth which exposes said closed cavities and forming open hollows, wherein said etching continues to a depth which does not expose said spaced conductive lines;

covering the remaining first spin-on-glass layer with a second spin-on-glass layer whereby said open hollows are filled with said second spin-on-glass layer, said second spin-on-glass layer has a thickness of between about 1000 and 6000 Å;

curing both said first and second spin-on-glass layers;

anisotropically etching at least said second spin-on-glass layer to expose at least portions of the first dielectric layer over the spaced conductive lines; and depositing a second dielectric layer over said first and second spin-on-glass layers to complete said planarization, said second dielectric layer having a thickness in a range of between about 2000 and 6000 Å;

anisotropically etching via holes in selected locations through said first and second dielectric layers to expose said spaced conductive lines; and forming metal contacts through said via holes to contact said conductive lines.

17. The method of claim 16 which further includes curing said first spin-on-glass layer prior to said anisotropically etching of said first spin-on-glass layer.

18. The method of claim 16 wherein said first dielectric layer is composed of silicon oxide formed by a plasma enhanced chemical vapor deposition process.

19. The method of claim 16 wherein said first spin-on-glass layer is formed by applying more than one spin-on-glass layers.

20. The method of claim 16 wherein said first spin-on-glass layer is composed of a material selected from the group consisting of silicate and siloxane.

21. The method of claim 16 wherein said first spin-on-glass layer is formed of a siloxane material.

22. The method of claim 16 wherein said second spin-on-glass layer is composed of a material selected from the group consisting of silicate and siloxane.

23. The method of claim 16 wherein said second spin-on-glass layer is formed by applying more than one spin-on-glass layers.

24. A method of planarizing the dielectric layers between conductor layers in integrated circuits without the incorporation of closed cavities in said dielectric layers comprising:

providing device structures in and on a semiconductor substrate;

providing at least one patterned conductive layer having spaced conductive lines for contacting of said device structures; said spaced conductive lines and the surface of said substrate present a non-planar top surface having valleys between said spaced conductive lines; the distance between said spaced conductive lines is in a range of between about 0.3 and 1.0 μm;

forming a first dielectric layer over said non-planar top surface whereby closed cavities can be formed between said spaced conductive lines; said first dielectric layer has a thickness greater than one half of the distance between said spaced conductive lines, said first dielectric layer is composed of silicon oxide formed by a plasma enhanced chemical vapor deposition process; said first dielectric layer has a thickness in the range of about 3000 to 10,000 Å;

covering said first dielectric layer with a first spin-on-glass layer; said first spin-on-glass layer composed of siloxane;

curing said first spin-on-glass layer;

anisotropically etching said first spin-on-glass layer and said first insulator layer to a depth which exposes said closed cavities and forming open voids, wherein said etching continues to a depth which does not expose said spaced conductive lines; the anisotropic etch back of said first spin-on-glass layer has the conditions of about: a $CHF_3$ flow of between about 27 and 33 sccms, a $CF_4$ flow between about 45 to 55 sccm, a Pressure between about 270 to 330 mtorr, and a Power between about 450 to 550 watts;

covering the remaining first spin-on-glass layer with a second spin-on-glass layer whereby said open hollows are filled with said second spin-on-glass layer, said second spin-on-glass layer has a thickness of between about 1000 and 6000 Å;

curing both said first and second spin-on-glass layers;

anisotropically etching at least said second spin-on-glass layer to expose at least portions of the first dielectric layer over the spaced conductive lines; and depositing a second dielectric layer over said first and second spin-on-glass layers to complete said planarization, said second dielectric layer having a thickness of between about 2000 to 6000 Å and is formed by a plasma enhanced chemical vapor deposition process;

anisotropically etching via holes in selected locations through said first and second dielectric layers to expose said spaced conductive lines; and forming metal contacts through said via holes to contact said conductive lines.

* * * * *